United States Patent [19]

Markle

[11] Patent Number: 5,003,345
[45] Date of Patent: Mar. 26, 1991

[54] APPARATUS AND METHOD FOR ALIGNING AND FOCUSING AN IMAGE OF A RETICLE ONTO A SEMICONDUCTOR WAFER

[75] Inventor: David A. Markle, Saratoga, Calif.

[73] Assignee: General Signal Corporation, Conn.

[21] Appl. No.: 458,482

[22] Filed: Dec. 27, 1989

[51] Int. Cl.$^5$ .............................................. G03B 27/42
[52] U.S. Cl. ......................................... 355/53; 355/67
[58] Field of Search .............................. 355/53, 67, 77

[56] References Cited

U.S. PATENT DOCUMENTS

| 4,370,054 | 1/1983 | Isohata et al. | 355/53 |
| 4,422,754 | 12/1983 | Isohata et al. | 355/53 |
| 4,572,659 | 2/1986 | Omata | 355/67 |
| 4,682,885 | 7/1987 | Torigoe | 355/67 |
| 4,757,354 | 7/1988 | Sato et al. | 355/53 |

*Primary Examiner*—Monroe H. Hayes
*Attorney, Agent, or Firm*—Flehr, Hohbach, Test, Albritton & Herbert

[57] ABSTRACT

A projection system provides a primary mirror with a thin nearly concentric shell which functions as a first mirror at shorter wavelengths for exposure purposes and functions as a second mirror surface at longer wavelengths for alignment purposes. The coating on the front surface of the shell is reflective to the exposing wavelengths and transmissive to the alignment illumination, and the coating on the back of the shell is reflective to the alignment wavelengths. This provides good focus and alignment of the images over two spectral regions.

3 Claims, 1 Drawing Sheet

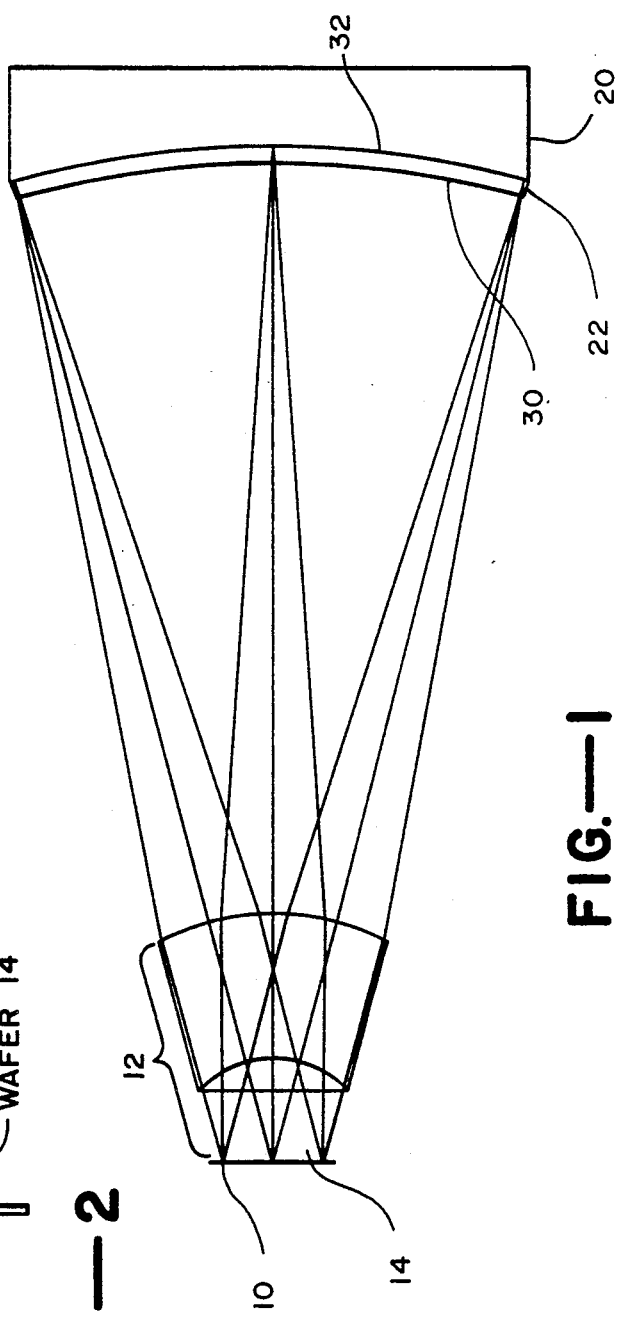
FIG.—1
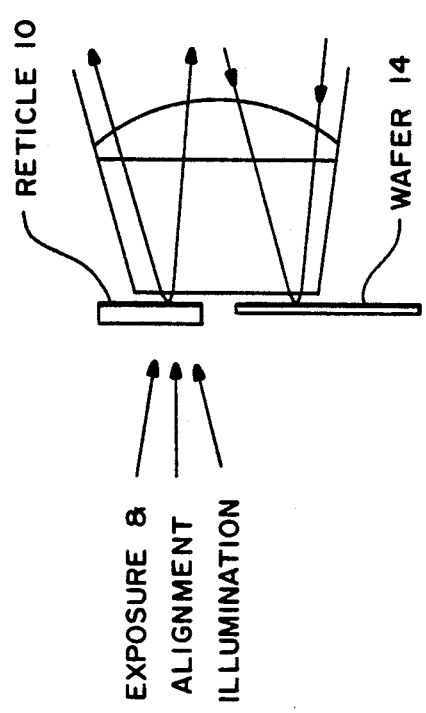
FIG.—2

APPARATUS AND METHOD FOR ALIGNING AND FOCUSING AN IMAGE OF A RETICLE ONTO A SEMICONDUCTOR WAFER

BACKGROUND OF THE INVENTION

The present invention relates to an improved apparatus and method for use in a focus and alignment system for aligning and focusing an image of a reticle onto a semiconductor wafer.

Current alignment systems such as described in use in U.S. Pat. Nos. 4,425,037 and 4,391,494 take advantage of the fact that reasonably good imaging is obtained in the visible part of the spectrum (546 to 580 nm) with a Wynne-Dyson corrected for optimum imaging at 405 and 436 nm. Because of longitudinal color, the visible image is defocused five to eight microns. Although this would be a detriment to obtaining excellent imaging in the visible range, it can be accommodated in a system which only serves to align the reticle image on the wafer at visible wavelengths.

This fortuitous circumstance no longer pertains when the corrected spectral range of the Wynne-Dyson is further away from the desired alignment wavelengths. For example, a DUV (248 nm) Wynne-Dyson might exhibit 50 microns or more longitudinal color in the visible range.

The problem can be avoided by aligning at the exposure wavelength, but this can result in two serious disadvantages. The alignment operation partially exposes the pattern before it is aligned, and in some cases the resist through which the alignment mark on the wafer must be seen is opaque at the exposure wavelengths, making alignment impossible. Thus, there is need to have a Wynne-Dyson system corrected over two wavelength ranges; one corresponding to the exposure spectrum and the other to the alignment spectrum.

SUMMARY OF THE INVENTION

It is an object of the present invention to provide an improved focus and alignment system for aligning and focusing the image of a reticle to a semiconductor wafer.

The present invention is intended to be utilized, in one preferred embodiment, in a focus and alignment system including a wafer, a reticle and a light source means where the light source means includes means for imaging a first light source having alignment light wavelengths for aligning the image of the reticle to the wafer and means for imaging a second light source having exposure light wavelengths for exposing the image of the reticle to the wafer.

The apparatus according to the present invention includes a primary mirror means including a thin, substantially concentric shell having a front and back surface. The front surface of the shell includes means for reflecting the exposure wavelengths from the reticle to the wafer to expose the reticle image onto the wafer, and means for transmitting the alignment wavelengths to the back surface. The back surface of the shell includes means for reflecting the alignment wavelengths to the wafer to align the reticle image to the wafer.

Additional objects, advantages and novel features of the present invention will be set forth in part in the description which follows and in part become apparent to those skilled in the art upon examination of the following or may be learned by practice of the invention The objects and advantages of the present invention may be realized and attained by means of the instrumentalities and combinations which are pointed out in the appended claims.

BRIEF DESCRIPTION OF THE DRAWINGS

The accompanying drawings which are incorporated in and form a part of this specification illustrate an embodiment of the invention and, together with the description, serve to explain the principles of the invention.

FIG. 1 depicts a diagram of an improved projection system according to the present invention.

FIG. 2 depicts a diagram of the reticle and wafer which forms a portion of FIG. 1.

DETAILED DESCRIPTION OF THE DRAWINGS

Reference will now be made in detail to the preferred embodiment of the invention, an example of which is illustrated in the accompanying drawings. While the invention will be described in conjunction with the preferred embodiment, it will be understood that it is not intended to limit the invention to that embodiment. On the contrary, it is intended to cover alternatives, modifications and equivalents as may be included within the spirit and scope of the invention as defined by the appended claims.

Referring now to FIG. 1, a diagram of an improved projection system 10 is depicted.

In FIG. 1, a projection system images a reticle 10 through a refractive lens group 12 to a primary mirror means 20.

The present invention provides this capability for two spectral regions by including a primary mirror means 20 which has a thin nearly concentric shell 22 which functions as a first mirror 30 at shorter wavelengths (exposure) and as a Mangin or second mirror surface 32 at longer wavelengths (for alignment purposes).

This requires that the coating on the front surface 30 of the shell 22 be reflective to the exposing wavelengths and transmissive to the alignment illumination. It also requires that the coating on the back shell 32 be reflective to the alignment wavelengths. This aspect is illustrated in FIG. 1.

It can be seen in FIG. 1 that the front surface 30 of the shell 22 reflects short wavelengths of the image of the reticle 10 for exposure onto the wafer 14. The front surface 30 of the primary mirror means 22 is transmissive to the alignment illumination wavelengths which are then transmitted to the back surface 32 of shell 22.

The back surface 32 of the shell 22 reflects the longer wavelengths for alignment of the reticle 10 to the semiconductor wafer 14.

FIG. 2 shows a more detailed view of the reticle 10 and wafer 14. The exposure, alignment and illumination are shown in FIG. 2.

It can be seen, therefore, that the present invention provides an improved system and method for correcting a Wynne-Dyson system over a second wavelength range which is useful for reticle to wafer alignment.

The foregoing description of the preferred embodiment of the invention has been presented for purposes of illustration and description. It is not intended to be exhaustive or to limit the invention to the precise form disclosed, and many modifications and variations are possible in light of the above teaching. The preferred embodiment was chosen and described in order to best explain the principles of the invention and its practical applications to thereby enable others skilled in the art to best utilize the invention and its various embodiments and with various modifications as are suited to the particular use contemplated. It is intended that the scope of the invention be defined only by the claims appended hereto.

What is claimed is:

1. In a projection system including a wafer, a reticle, and light source where said light source includes alignment light wavelengths for aligning the image of said reticle to said wafer and light wavelengths for exposing said image onto said wafer, the apparatus comprising primary mirror means including a thin substantially concentric shell having a front and back surface, said front surface including means for reflecting said exposure wavelengths from said reticle to said wafer to expose said image onto said wafer, and means for transmitting said alignment wavelengths to said back surface, said back surface of said shell including means for reflecting said alignment wavelengths to said wafer to align said reticle image to said wafer.

2. A projection system comprising a wafer, a reticle, a light source having alignment light wavelengths for aligning the image of said reticle to said wafer, and exposure light wavelengths for exposing said image onto said wafer, primary mirror means including a thin substantially concentric shell having a front and back surface, said front surface including means for reflecting said exposure wavelengths from said reticle to said wafer to expose said image onto said wafer, and means for transmitting said alignment wavelengths to said back surface, said back surface of said shell including means for reflecting said alignment wavelengths to said wafer to align said reticle image to said wafer.

3. In a projection system including a wafer, a reticle, and light source means where said light source has alignment light wavelengths for aligning the image of said reticle to said wafer and wavelengths for exposing said image onto said wafer, primary mirror means including a thin substantially concentric shell having a front and back surface, the method comprising the steps of transmitting said alignment wavelengths through said front surface to said back surface, reflecting said alignment wavelengths from said back surface to said wafer to align said reticle image to said wafer, and reflecting said exposure wavelengths from said front surface to said wafer to expose said image onto said wafer.

* * * * *